(12) United States Patent
Lee et al.

(10) Patent No.: US 7,221,590 B2
(45) Date of Patent: May 22, 2007

(54) FLASH MEMORY DEVICES HAVING POWER LEVEL DETECTION CIRCUITS

(75) Inventors: Jung-Woo Lee, Gyeonggi-do (KR); June Lee, Seoul (KR); Hyoung-Woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 11/020,900

(22) Filed: Dec. 23, 2004

(65) Prior Publication Data

US 2006/0018155 A1 Jan. 26, 2006

(30) Foreign Application Priority Data

Jul. 26, 2004 (KR) .................... 10-2004-0058172

(51) Int. Cl.
*G11C 16/04* (2006.01)
(52) U.S. Cl. ............. 365/185.18; 365/226; 365/185.05
(58) Field of Classification Search ........... 365/185.18, 365/226, 285.05, 185.05
See application file for complete search history.

(56) References Cited

U.S. PATENT DOCUMENTS

| 5,428,580 | A |  | 6/1995 | Kawashima et al. |
| 5,444,664 | A | * | 8/1995 | Kuroda et al. ............... 365/226 |
| 5,930,168 | A |  | 7/1999 | Roohparvar |
| 6,661,710 | B2 |  | 12/2003 | Kwon |
| 6,801,455 | B2 | * | 10/2004 | Natori .................... 365/185.18 |
| 6,982,919 | B2 | * | 1/2006 | Kumahara et al. .......... 365/226 |

FOREIGN PATENT DOCUMENTS

KR 1998-0011497 4/1998

* cited by examiner

*Primary Examiner*—David Lam
(74) *Attorney, Agent, or Firm*—Myers Bigel Sibley & Sajovec

(57) ABSTRACT

Flash memory devices are provided including a power supply pad unit. The power supply pad unit includes a first power supply pad, a second power supply pad and a power level detection circuit. The first power and second power supply pads are electrically coupled to the power level detection circuit.

10 Claims, 3 Drawing Sheets

FLASH MEMORY DEVICES HAVING POWER LEVEL DETECTION CIRCUITS

CLAIM OF PRIORITY

This application is related to and claims priority from Patent Application No. 2004-58172 filed on Jul. 26, 2004, the disclosure of which is hereby incorporated herein by reference as if set forth in its entirety.

FIELD OF THE INVENTION

The present invention relates generally to semiconductor devices and, more particularly, to flash memory devices.

BACKGROUND OF THE INVENTION

A power level detection circuit of a flash memory device is configured to detect a voltage level of an internal power supply voltage (VDD) of the flash memory device and initialize the flash memory device when an internal power supply voltage (VDD) is greater than a critical (threshold) voltage level. In other words, when the power supply voltage (VDD) of the flash memory device is greater than a threshold voltage level, the power level detection circuit may be configured to generate control signals. The flash memory device may be initialized by the generated control signals.

During the initialization process of the flash memory device, signals may be applied to the flash memory device in order to obtain product information of the flash memory device. Response signals may be received from the flash memory device in response to the applied signals so that the product information of the flash memory device may be obtained.

FIG. 1 is a block diagram illustrating a layout design of conventional flash memory devices having power level detection circuits. As illustrated therein, the conventional flash memory device includes a memory cell array unit 100, a main circuit unit 120, an input/output pad unit 140, and a power supply pad unit 160. The memory cell array unit 100 includes a plurality of memory cells (not shown). Some conventional memory cells include floating gates and data may be stored/erased in the plurality of memory cells using erase and programming operations known to those having skill in the art. Furthermore, data may be read from the memory cell by applying a predetermined voltage to a control gate of the memory cell. As further illustrated in FIG. 1, the memory cell array unit 100 may be provided in a central region of the flash memory device and may occupy a significant portion of an area of the flash memory device.

The main circuit unit 120 is provided in a peripheral region of the memory cell array unit 100. The main circuit unit 120 is provided adjacent to a side of the memory cell array unit 100. The main circuit unit 120 includes a plurality of circuits for controlling operations of the memory cells (not shown). In particular, the main circuit unit 120 includes the power level detection circuit 125.

The input/output pad unit 140 is also provided in a peripheral region of the flash memory device. The input/output pad unit 140 is provided adjacent to the main circuit unit 120. The input/output pad unit 140 includes one or more input/output pads 145. Data may be input through or output from the input/output pads 140, for example, command signals and addresses may be received at the flash memory device through the input/output pads 140.

The power supply pad unit 160 is also provided in a peripheral region of the flash memory device. The power supply pad unit 160 is provided adjacent to the memory cell array unit 100. In particular, the power supply pad unit 160 is provided on an opposite side of the memory cell array unit from the main circuit unit 120 and the input/output pad unit 140. The power supply pad unit 160 includes a plurality of power supply pads, including a first power supply pad VDD pad 162 and a second power supply pad VSS 164.

As illustrated in FIG. 1, the power level detection circuit 125 is provided in the main circuit unit 120, which is spaced apart from the power supply pad unit 160. Thus, the power level detection circuit 125 is spaced apart from the first power supply pad VDD 162 and the second power supply pad VSS 164. In order to properly operate the power level detection circuit 125, power supply lines are provided between the power level detection circuit 125 and the power supply pads of the power supply pad unit 160 that electrically couple the power level detection circuit 125 to the power supply pads of the power supply pad unit. Accordingly, as a length of the power supply line increases, the level of the power voltage applied to the power level detection circuit 125 from the power supply pad unit 160 may be affected. For example, noise may be introduced and may cause the level of the power voltage applied to the power level detection circuit 125 to increase or decrease.

If the power supply lines are affected by noise, the power supply voltage applied to the power level detection circuit 125 may be unstable, which may cause abrupt changes in a short period of time. In particular, if the power supply voltage level rapidly drops below the threshold voltage and then rapidly rises above the threshold voltage, the power level detection circuit may not function properly, which may cause improper operation of the flash memory device.

SUMMARY OF THE INVENTION

Some embodiments of the present invention provide flash memory devices including a power supply pad unit. The power supply pad unit includes a first power supply pad, a second power supply pad and a power level detection circuit. The first power and second power supply pads are electrically coupled to the power level detection circuit.

In further embodiments of the present invention, the power supply pad unit may further include at least one input/output pad. The power level detection circuit may be electrically coupled to the first power supply pad and the second power supply pad via a power supply line such that a length of the power supply line may be reduced based on positions of the first and second power supply pads relative to the power level detection circuit. In certain embodiments of the present invention, the power level detection circuit may be between the first power supply pad and the second power supply pad. In other embodiments of the present invention, the first power supply pad may be between the power level detection circuit and the second power supply pad.

In still further embodiments of the present invention, a memory cell array unit may be provided in a first region of the flash memory device that is configured to store data and a main circuit unit may be provided in a second region of the flash memory device peripheral to the first region of the flash memory device. The main circuit region may be configured to control operations of the memory cell array unit. The power supply pad unit may be in a third region of the flash memory device peripheral to the first region of the flash memory device.

In some embodiments of the present invention, a memory cell array unit may be provided in a first region of the flash memory device that is configured to store data. A main circuit unit may be provided in a second region of the flash memory device peripheral to the first region of the flash memory device. The main circuit region may be configured to control operations of the memory cell array unit. An input/output pad unit may be provided in a third region of the flash memory device peripheral to the first region of the flash memory device. The input/output pad unit may include at least one input/output pad and may be configured to transfer the stored data of the memory cell array unit. The power supply pad unit is provided in a fourth region of the flash memory device peripheral to the first region of the flash memory device.

DETAILED DESCRIPTION OF EMBODIMENTS OF THE PRESENT INVENTION

Figure 1:
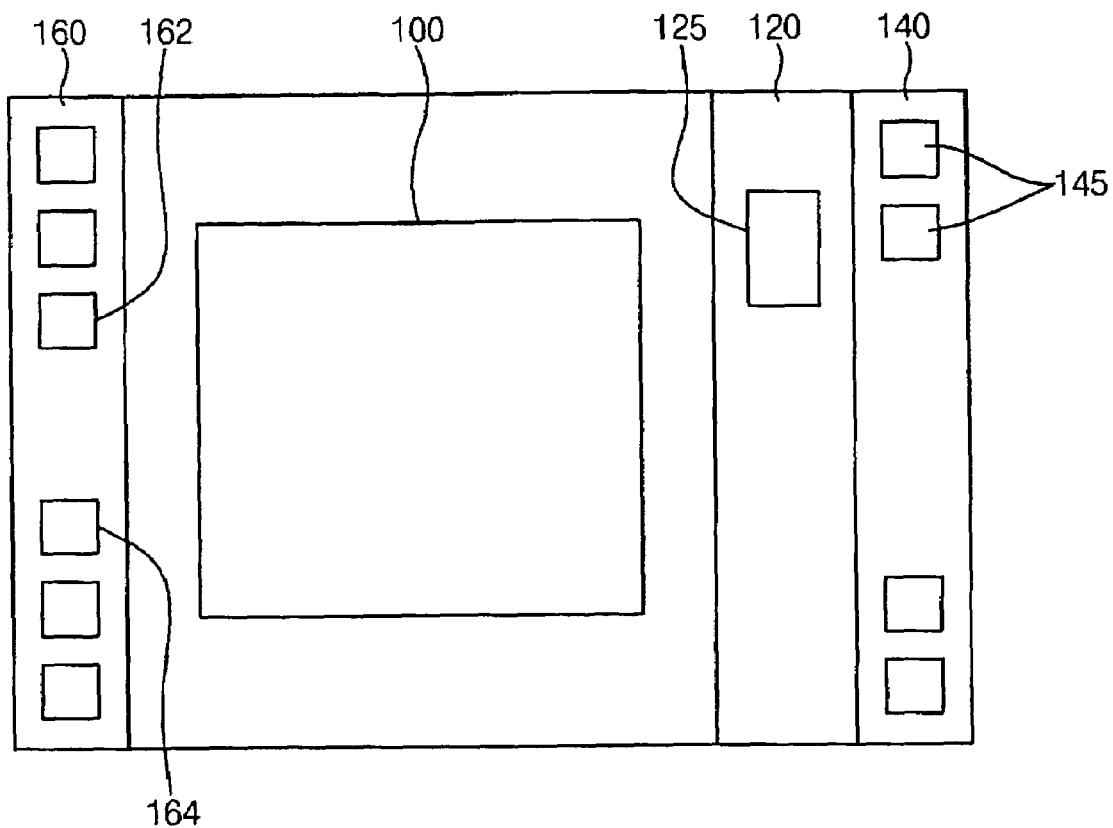
FIG. 1 is a block diagram illustrating a layout design of conventional flash memory devices having power level detection circuits.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
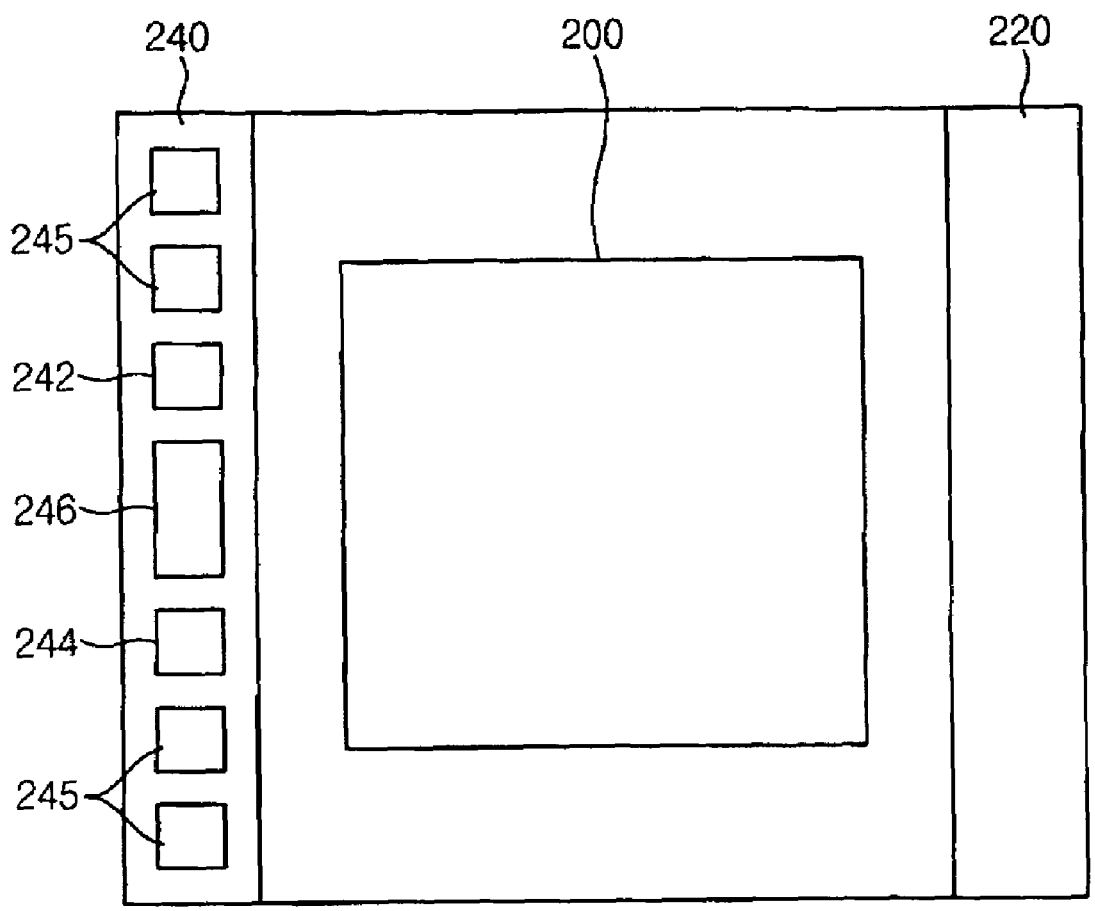
FIG. 2 is a block diagram illustrating a layout design of flash memory devices according to some embodiments of the present invention.

Referring now to FIG. 2, a block diagram illustrating a layout diagram of flash memory devices according to some embodiments of the present invention will be discussed. As illustrated in FIG. 2, flash memory devices according to some embodiments of the present invention include a memory cell array unit 200, a main circuit unit 220 and a power supply pad unit 240. The memory cell array unit 200 includes a plurality of blocks (not shown and ones of the blocks include a plurality of pages (not shown). The number of the blocks included in the memory cell array unit 200 depends on a storage capacity of the flash memory device.

The main circuit unit 220 is provided in a first region of the flash memory device spaced apart from the memory cell array unit 200. The main circuit unit 220 controls operations of the memory cell array unit. The power supply pad unit 240 is provided in a second region peripheral to the memory cell array unit. As illustrated in FIG. 2, the power supply pad unit 240 according to some embodiments of the present invention includes one or more input/output pads 245, a first power supply pad VDD 242 and a second power supply pad VSS 244. For example, the first power supply pad VDD 242 may receive a positive power supply voltage VDD and the second power supply pad VSS 244 may receive a ground voltage or a negative voltage. Addresses, data and control signals are input to and/or output from the flash memory device via the input/output pads.

As further illustrated in FIG. 2, the power supply unit 240 further includes a power level detection circuit 246 between the first power supply pad 242 and the second power supply pad 244. In embodiments of the present invention illustrated in FIG. 2, the first power supply pad 242 is disposed in an upper region of the power supply unit 240 adjacent to the power level detection circuit 246 and the second power supply pad 244 is disposed in a lower region of the power supply unit 240 adjacent to the power level detection circuit 246. It will be understood that the positions of the first and second power supply pads 242 and 244 relative to the power level detection circuit 246 provided in FIG. 2 are provided for exemplary purposes only and embodiments of the present invention should not be limited to this configuration. For example, the first power supply pad 242 may be disposed in the lower region of the power supply unit 240 adjacent to the power level detection circuit 246 and the second power supply pad 244 may be disposed in the upper region of the power supply unit 240 adjacent to the power level detection circuit 246 without departing from the scope of the present invention.

One or more pads, for example, an input/output pad 245, may be provided between the first power supply pad 242 and the second power supply pad 244. The power level detection circuit 246 may be provided in an upper or lower region of the power supply unit 240 adjacent to the first power supply pad 242 and the second power supply pad 244 without departing from the scope of the present invention. In other words, the first power supply pad 242 may be spaced apart from the second power supply pad 244 and the power level detection circuit 246 may be provided in the upper or lower region of the power supply unit 240 adjacent to the first power supply pad 242 and the second power supply pad 244.

In some embodiments of the present invention, one or more pads may be provided between the power level detection circuit 246 and the first power supply pad 242. Alternatively, one or more pads may be provided between the power level detection circuit 246 and the second power supply pad 242. The power supply pad unit 240 and the main circuit unit 220 may be provided in a peripheral region of the flash memory device relative to the memory cell array unit 200. As illustrated in FIG. 2, the power supply pad unit 240 and the main circuit unit 220 are respectively provided in different peripheral regions with respect to the memory cell array unit 200. In other words, if the power supply pad unit 240 is disposed in a first region peripheral to the memory cell array unit 200, the main circuit unit 220 is disposed in the upper region or lower region of the memory cell array unit 200 or on an opposite side of the memory cell array unit 200 than the power supply pad unit 240.

According to embodiments of the present invention illustrated in FIG. 2, the power level detection circuit 246 is disposed in the power supply pad unit 240, adjacent to the first power supply pad 242 and the second power supply pad 244. Thus, a length of a power supply line electrically coupling the power level detection circuit 246 to the first and second power supply pads 242 and 244 may be reduced relative to power supply lines used in conventional flash memory devices. Thus, the length of the power supply line may be reduced based on the position of the power level detection circuit 246 relative to the first and/or second power supply pads 242 and 244. Accordingly, an amount of noise introduced by the power supply line may be reduced according to some embodiments of the present invention.

Figure 3:
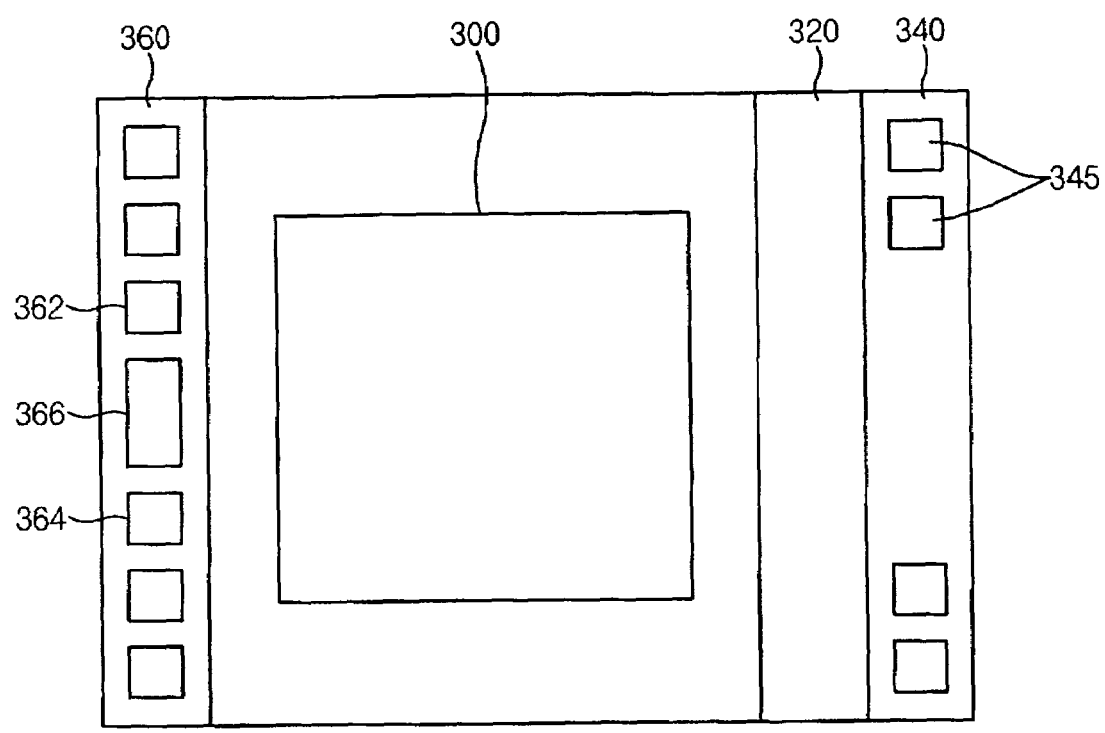
FIG. 3 is a block diagram illustrating a layout design of flash memory devices according to further embodiments of the present invention.

Referring now to FIG. 3, a block diagram illustrating a layout diagram of flash memory devices according to further embodiments of the present invention. As illustrated in FIG. 3, the flash memory device includes a memory cell array unit 300, a main circuit unit 320, an input/output pad unit 340, and a power supply pad unit 360. The memory cell array unit 300 and the main circuit unit 320 are similar to those discussed above with respect to FIG. 2 and, therefore, will not be discussed in further detail herein.

The main circuit unit 320 is provided in a first region of the flash memory device spaced apart from the memory cell array unit 300. The input/output pad unit 340 includes one or more input/output pads 345 and is provided in a second region of the flash memory device peripheral to the memory cell array unit. The input/output pad unit 340 receives address signals, data signals, and at least one control signal via the plurality of input/output pads. Furthermore, data stored in a memory cell that corresponds to a predetermined address may be output to an external device of the flash memory device via the input/output pads.

The power supply pad unit 360 includes a first power supply pad 362, a second power supply pad 364 and a power level detection circuit 366. As illustrated in FIG. 3, the power level detection circuit 366 is provided between the first power supply pad 362 and the second power supply pad 364.

In embodiments of the present invention illustrated in FIG. 3, the first power supply pad 362 is provided in the upper region of the power supply unit 340 adjacent to the power level detection circuit 366 and the second power supply pad 364 is disposed in the lower region of the power supply unit 340 adjacent to the power level detection circuit 366. However, as discussed above with respect to FIG. 2, embodiments of the present invention are not limited to the configuration illustrated in FIG. 3.

One or more pads may be provided between the first power supply pad 362 and the second power supply pad 364. The power level detection circuit 366 may be disposed in the upper or lower region of the power supply unit 340 adjacent to the first power supply pad 362 and the second power supply pad 364. In particular, the first power supply pad 362 may be spaced apart from the second power supply pad 364 and the power level detection circuit 366 may be provided in the upper or lower region of the power supply unit 340 adjacent to the first power supply pad 362 and the second power supply pad 364.

One or more pads may be provided between the power level detection circuit 366 and the first power supply pad 362 or between the power level detection circuit 366 and the second power supply pad 364 without departing from the scope of the present invention. The power supply pad unit 360 and the main circuit unit 320 may be disposed in a peripheral region peripheral to the memory cell array unit 300.

As illustrated in FIG. 3, the power supply pad unit 360 and the main circuit unit 320 are respectively disposed in different peripheral regions with respect to the memory cell array unit 300. Thus, if the power supply pad unit 360 is disposed in a first region adjacent to the memory cell array unit 300, the main circuit unit 320 is disposed in the upper region or lower region adjacent to the memory cell array unit 300 or on an opposite side of the memory cell array unit 300 from the power supply pad unit 360. The input/output pad unit 340 is provided in some region peripheral to the memory cell array unit 300.

According to embodiments of the present invention illustrated in FIG. 3, the input/output pad unit 340 is provided in a region on a right side of the memory cell array unit 300 and the main circuit unit 320 is disposed between the memory cell array unit 300 and the input/output pad unit 340. However, embodiments of the present invention are not limited to this configuration. For example, the input/output pad unit 340 may be disposed in any region (upper, lower, left or right region) peripheral to the memory cell array unit 300.

As discussed briefly above with respect to FIGS. 2 and 3, power level detection circuits according to embodiments of the present invention are disposed in the power supply pad unit and adjacent to the first power supply pad and the second power supply pad. As a result, a length of a power supply line electrically coupling the first and second power supply pads and the power level detection circuit may be reduced relative to convention power supply lines. Thus, power level detection circuits according to embodiments of the present invention may provide improved performance and a reduced amount of noise.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A flash memory device comprising a power supply pad unit including a first power supply pad, a second power supply pad and a power level detection circuit, wherein the power level detection circuit is disposed in a direct line between the first power supply pad and the second power supply pad and wherein the power level detection circuit is electrically coupled to the first power supply pad and the second power supply pad via a power supply line such that a length of the power supply line is reduced based on positions of the first and second power supply pads relative to the power level detection circuit.

2. The device of claim 1, wherein the power supply pad unit further includes at least one input/output pad.

3. The device of claim 2, further comprising:
a memory cell array unit in a first region of the flash memory device, the memory cell array unit being configured to store data; and
a main circuit unit in a second region of the flash memory device peripheral to the first region of the flash memory device, the main circuit region being configured to control operations of the memory cell array unit, wherein the power supply pad unit is in a third region of the flash memory device peripheral to the first region of the flash memory device.

4. The device of claim 2, further comprising:
a memory cell array unit in a first region of the flash memory device, the memory cell array being configured to store data;
a main circuit unit in a second region of the flash memory device peripheral to the first region of the flash memory device, the main circuit region being configured to control operations of the memory cell array unit; and
an input/output pad unit in a third region of the flash memory device peripheral to the first region of the flash memory device, the input/output pad unit including at least one input/output pad and being configured to transfer the stored data of the memory cell array unit, wherein the power supply pad unit is in a fourth region of the flash memory device peripheral to the first region of the flash memory device.

5. A flash memory device comprising:
a memory cell array unit in a first region of the flash memory device, the memory cell being configured to store data;
a main circuit unit in a second region of the flash memory device peripheral to the first region of the flash memory device and configured to control operation of the memory cell array unit; and
a power supply pad unit in a third region of the flash memory device peripheral to the first region of the flash memory device, the power supply pad unit including a plurality of input/output pads, a first power supply pad, a second power supply pad and a power level detection circuit, wherein the power level detection circuit is disposed in a direct line between the first power supply pad and the second power supply pad and wherein the power level detection circuit is electrically coupled to the first power supply pad and the second power supply pad via a power supply line such that a length of the power supply line is reduced based on positions of the first and second power supply pads relative to the power level detection circuit.

6. The device of claim 5, wherein the second and third regions are respectively disposed in different peripheral regions with respect to the memory cell array unit.

7. The device of claim 6, wherein the second and third regions are disposed opposite to each other with respect to the memory cell array unit.

8. A flash memory device comprising:
a memory cell array unit in a first region of the flash memory device, the memory cell array unit being configured to store data;
a main circuit unit in a second region of the flash memory device peripheral to the first region of the flash memory device, the main circuit unit being configured to control operation of the memory cell array unit;
an input/output pad unit in a third region of the flash memory device that is peripheral to the first region of the flash memory device, the input/output pad unit being configured to transfer the stored data of the memory cell array unit; and
a power supply pad unit in a fourth region peripheral of the flash memory device to the first region of the flash memory device, the flash memory device including a first power supply pad, a second power supply pad, and a power level detection circuit, wherein the power level detection circuit is disposed in a direct line between the first power supply pad and the second power supply pad and wherein the power level detection circuit is electrically coupled to the first power supply pad and the second power supply pad via a power supply line such that a length of the power supply line is reduced based on positions of the first and second power supply pads relative to the power level detection circuit.

9. The device of claim 8, wherein the second region including the main circuit unit and the fourth region including the power supply pad unit are respectively disposed in different peripheral regions with respect to the memory cell array unit.

10. The device of claim 9, wherein the second and fourth regions are disposed opposite to each other with respect to the memory cell array unit.

* * * * *